United States Patent [19]
Aokura et al.

[11] Patent Number: 5,609,739
[45] Date of Patent: Mar. 11, 1997

[54] SPUTTERING APPARATUS

[75] Inventors: Isamu Aokura, Osaka; Hitoshi Yamanishi; Youichi Ohnishi, both of Higashiosaka; Tanejiro Ikeda, Nara, all of Japan

[73] Assignee: Matsushita Electric Industrial Co., Ltd., Osaka, Japan

[21] Appl. No.: 362,778

[22] Filed: Dec. 23, 1994

[30] Foreign Application Priority Data

Dec. 24, 1993 [JP] Japan .................................. 5-328513
Jul. 20, 1994 [JP] Japan .................................. 6-167801

[51] Int. Cl.$^6$ .................................................. C23C 14/34
[52] U.S. Cl. .......................... 204/298.19; 204/192.12; 204/192.2; 204/298.16; 204/298.11
[58] Field of Search .................... 204/192.12, 192.2, 204/298.11, 298.16, 298.19

[56] References Cited

U.S. PATENT DOCUMENTS

| | | | |
|---|---|---|---|
| 4,880,515 | 11/1989 | Yoshikawa et al. | 204/298.19 X |
| 4,891,560 | 1/1990 | Okumura et al. | 204/298.19 X |
| 5,227,778 | 1/1994 | Daube et al. | 204/298.19 |
| 5,397,448 | 3/1995 | Gesche et al. | 204/298.19 X |
| 5,403,457 | 4/1995 | Nago et al. | 204/192.2 |

*Primary Examiner*—Nam Nguyen
*Attorney, Agent, or Firm*—Wenderoth, Lind & Ponack

[57] ABSTRACT

A sputtering apparatus for performing sputtering operation by using a rectangular target made of ferromagnetic material, the apparatus includes an electrode in which one first permanent magnet is disposed on each side edge of a front surface of the target, polarities of the first magnets confronting each other with the target interposed between the first magnets are opposite to each other, one second permanent magnet is disposed on each side edge of a rear surface of the target, polarities of the second magnets confronting each other with the target interposed between the second magnets are opposite to each other, and the polarity of each second magnet disposed on the rear surface of the target is the same as that of the first magnet disposed on the front surface of the target.

11 Claims, 9 Drawing Sheets

5,609,739

SPUTTERING APPARATUS

BACKGROUND OF THE INVENTION

The present invention relates to a sputtering apparatus for performing sputtering by magnetron sputtering method using a target made of ferromagnetic material to form a thin film such as a thin film used in a magnetic recording head for a VTR.

Sputtering method is used to generate plasma by giving rise to gas discharge in an atmosphere of a low degree of vacuum so that positive ions of the plasma collide with a target mounted on a negative pole called as a cathode. Particles sputtered by the collision between the positive ions and the cathode are deposited on a substrate to form a thin film. Sputtering method is widely used in a film forming process because the control over the composition of the film and the operation of an apparatus can be performed comparatively easily. But sputtering method has a disadvantage that the thin film forming speed thereof is lower than that of vacuum evaporation. In order to solve the disadvantage, magnetron sputtering method has been devised to form a magnetic field in the vicinity of the target by using permanent magnets or electromagnets as a magnetic circuit. Magnetron sputtering method has allowed the thin film forming speed of the apparatus to be higher and thin films to be mass-produced on substrates of semiconductor components and electronic components.

Magnetron sputtering method has, however, a disadvantage that a film formed on a substrate has a nonuniform thickness and hence a poor quality due to a local corrosion of the target. In order to solve the disadvantage, an apparatus for forming a uniform magnetic field perpendicular to an electric field has been devised.

An example of a conventional sputtering apparatus is described below with reference to FIG. 12 which is a sectional view showing the construction thereof. In FIG. 11, there are provided a chamber 1; an evacuation port 2 communicating with a vacuum pump; a gas introducing pipe 3; a gas flow rate controller; electric discharge gas 5 consisting of argon; a target 6; a sputtering electrode 7; an electric discharge power supply 8; magnet holders 9; magnets 10; a substrate holder 11; and a substrate 12 on which a thin film is formed.

The operation of the sputtering apparatus having the above-described construction is described below. The chamber 1 is evacuated from the exhaust port 2 at a degree of approximately $10^{-7}$ Torr. Then, the discharge gas 5 is introduced into the chamber 1 via the gas introducing pipe 3 connected with an end of the chamber 1 to keep the pressure in chamber 1 at approximately $10^{-3}$–$10^{-2}$ Torr. A negative voltage or a high frequency voltage is applied to the sputtering electrode 7 mounted on the target 6 by the DC or AC discharge power supply 8. As a result, plasma is generated in the vicinity of the front surface of the target 6 owing to discharge caused by the action of an electric field generated by the power supply 8 and a magnetic field generated by the magnets 10 accommodated in the magnet holders 9. Consequently, sputtering phenomenon occurs, i.e., particles sputtered from the target 6 are deposited on the substrate 12 mounted on the substrate holder 11 to form a thin film.

In the sputtering apparatus, most of magnetic fluxes generated by the magnets 10 passes through the target 6 if the target 6 is made of ferromagnetic material. Thus, the number of magnetic fluxes which contribute to the formation of plasma is small. As a result, the film forming speed is low.

SUMMARY OF THE INVENTION

An object of the present invention is to provide a sputtering apparatus capable of increasing a film forming speed.

In accomplishing these and other objects, according to one aspect of the present invention, there is provided a sputtering apparatus for performing sputtering operation by using a rectangular target made of ferromagnetic material, the apparatus comprising an electrode in which one first permanent magnet is disposed on each side edge of a front surface of the target, polarities of the first magnets confronting each other with the target interposed between the first magnets are opposite to each other, one second permanent magnet is disposed on each side edge of a rear surface of the target, polarities of the second magnets confronting each other with the target interposed between the second magnets are opposite to each other, and the polarity of each second magnet disposed on the rear surface of the target is the same as that of the first magnet disposed on the front surface of the target.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
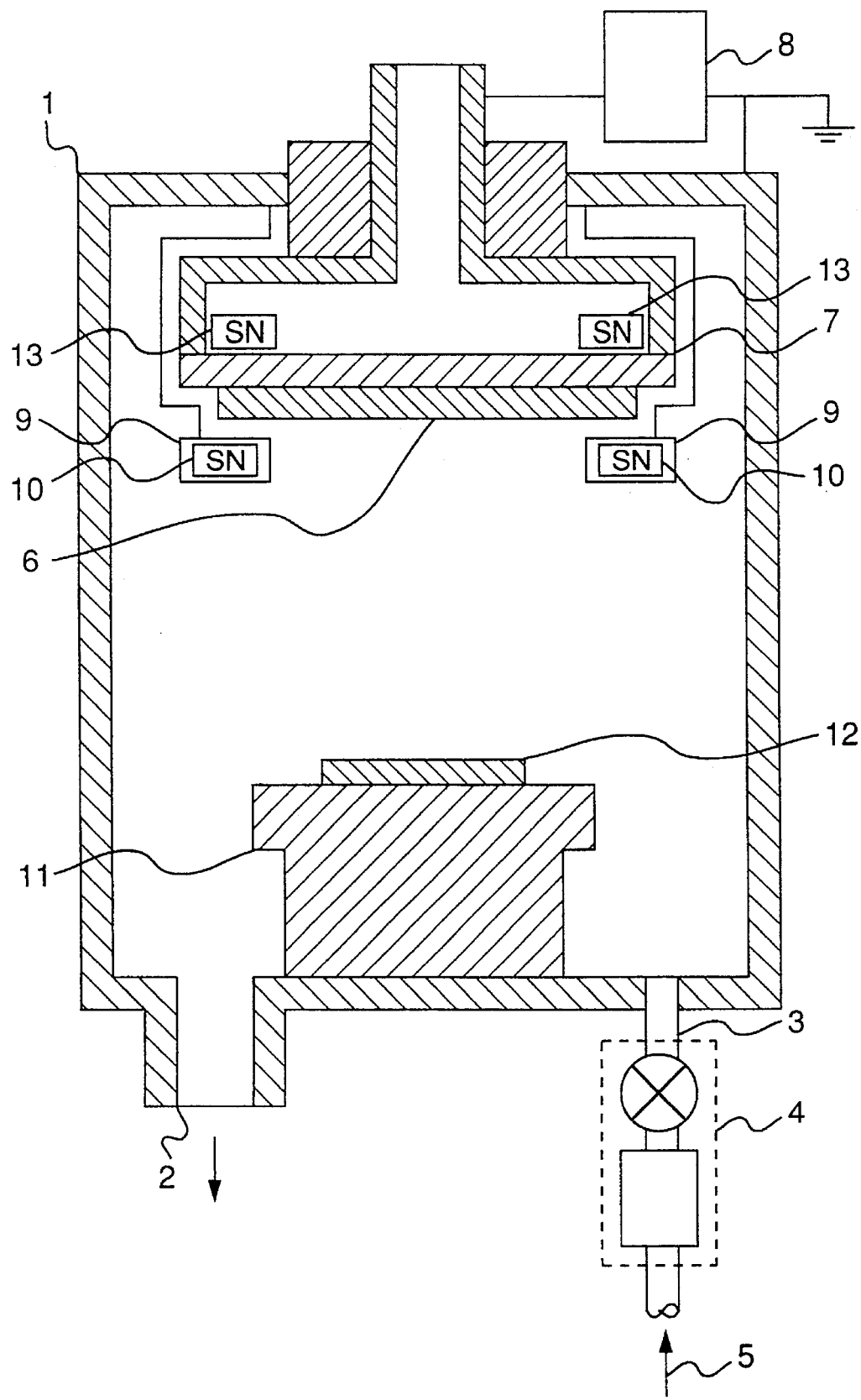
FIG. 1 is a sectional view showing the construction of a sputtering apparatus according to a first embodiment of the present invention.

Before the description of the present invention proceeds, it is to be noted that like parts are designated by like reference numerals throughout the accompanying drawings.

FIG. 1 shows the construction of a sputtering apparatus according to a first embodiment of the present invention. The sputtering apparatus comprises a chamber 1; an evacuation port 2 communicating with a vacuum pump; a gas introducing pipe 3 through which discharge gas 5 is introduced into the chamber 1; a gas flow rate controller 4 for controlling the flow rate of the electric discharge gas 5 consisting of argon; a target 6 rectangular and made of ferromagnetic material; a sputtering electrode 7a; a power supply 8 for discharge; magnet holders 9; permanent magnets 10 provided on the front surface (lower surface side) of the target 6 by the holders 9; a substrate holder 11 for holding a substrate 12 on which a thin film is formed; and permanent magnets 13 provided on the rear surface (upper surface side) of the target 6.

Figure 2:
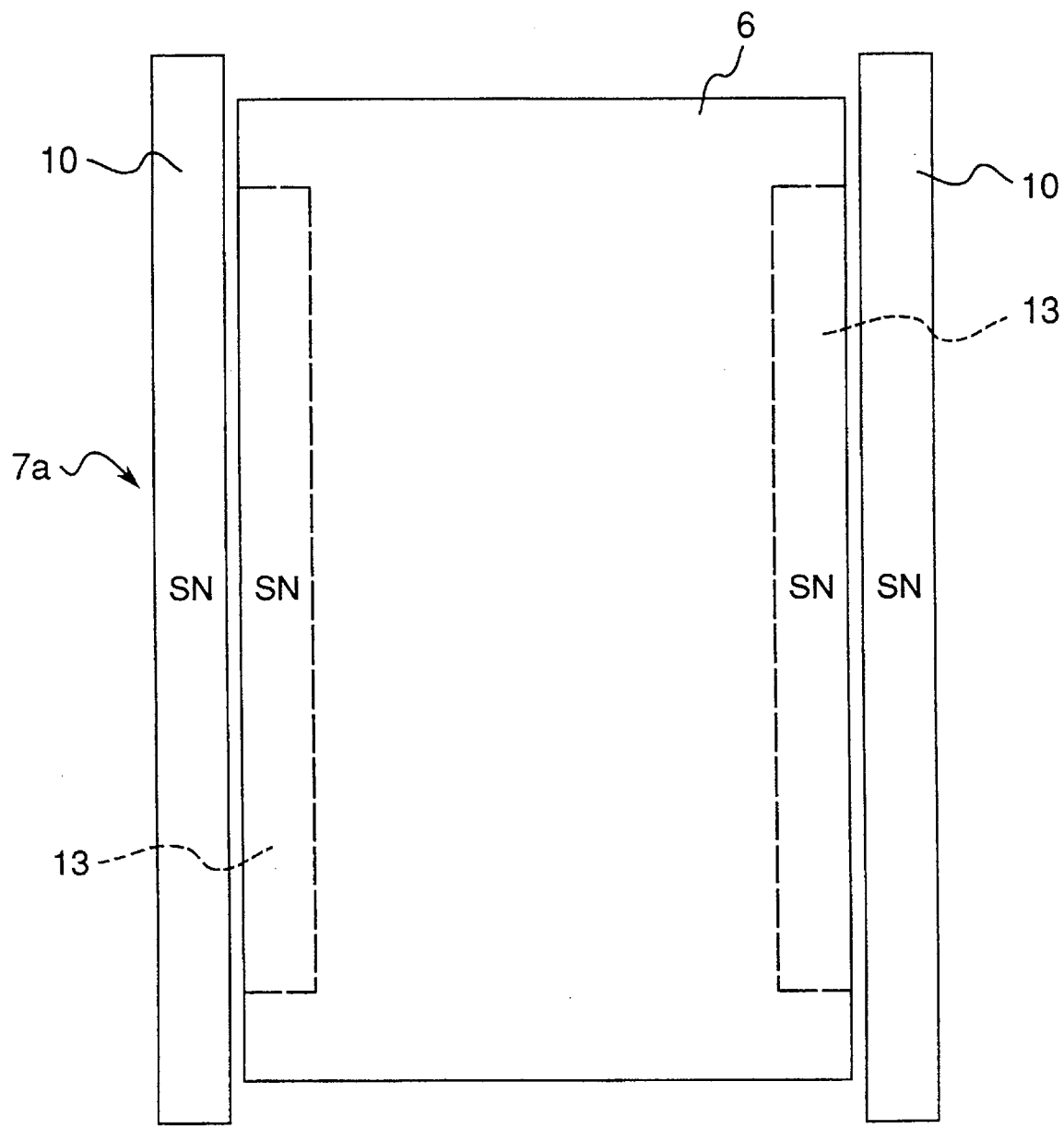
FIG. 2 is a plan view showing the construction of a sputtering electrode of the sputtering apparatus shown in FIG. 1.

FIG. 2 is a plan view showing the sputtering electrode 7a of the sputtering apparatus shown in FIG. 1.

The two magnets 10 are provided along both side edges of the front surface of the target 6. The polarities of the two magnets 10 confronting each other with the target 6 interposed therebetween are also set to be opposite to each other. The two magnets 13 are disposed on the rear surface of the target 6 in a manner similar to that of the magnet 10.

Figure 3:
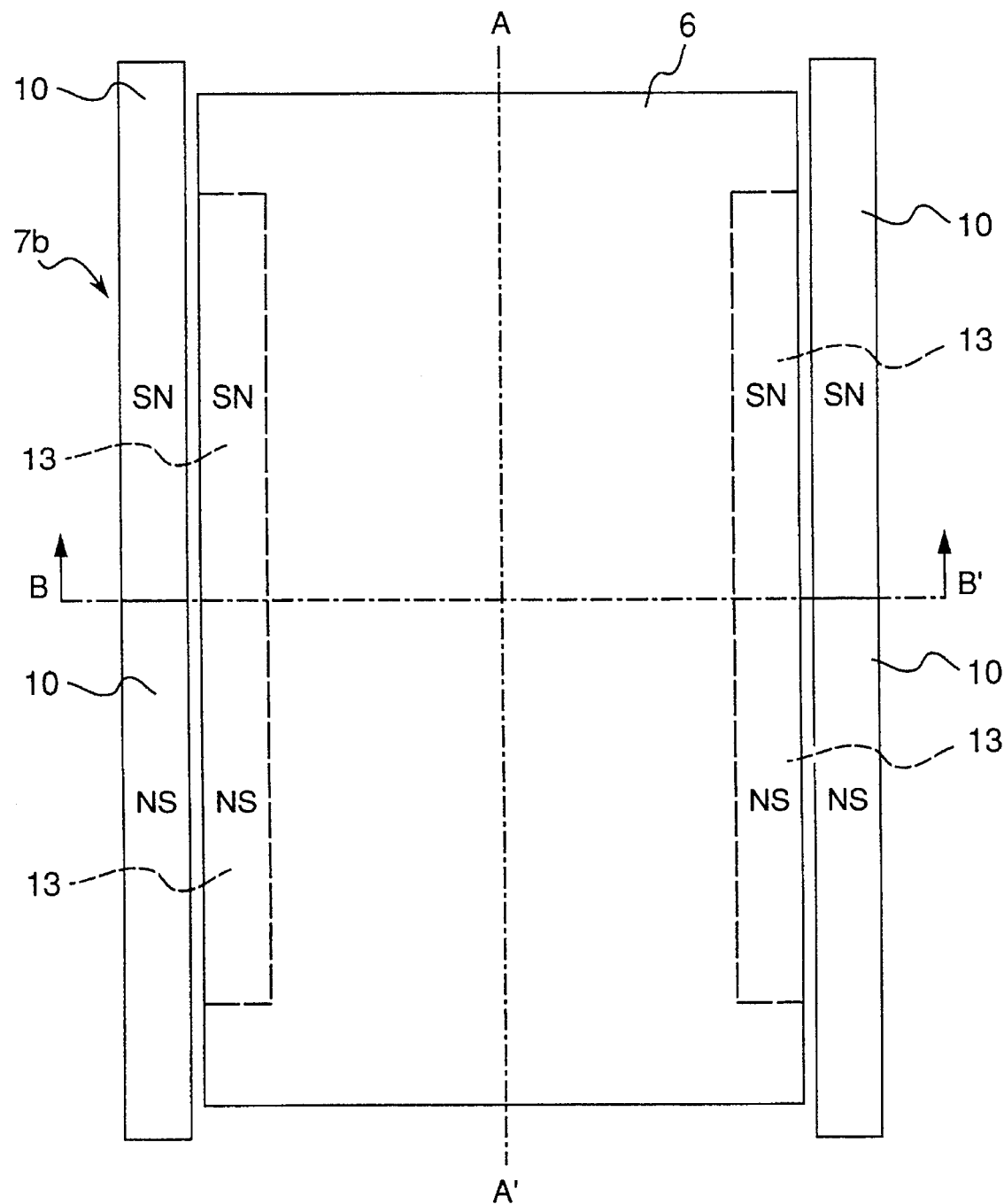
FIG. 3 is a plan view showing the construction of a sputtering electrode of a sputtering apparatus according to a second embodiment of the present invention.
Figure 4:
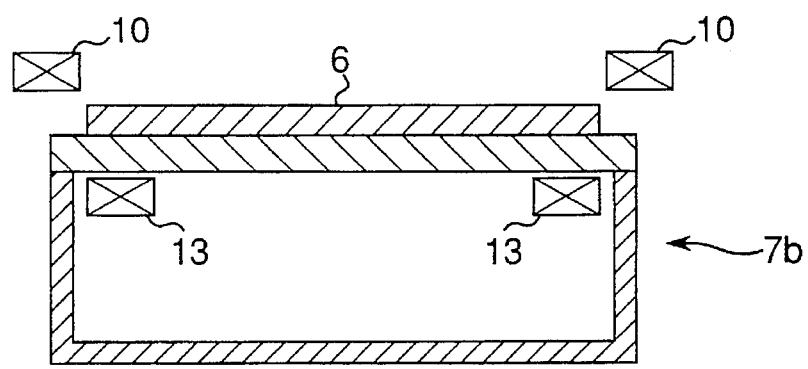
FIG. 4 is a sectional view taken along a line B—B' of FIG. 3.

FIG. 3 is a plan view showing a sputtering electrode 7b of a sputtering apparatus according to a second embodiment of the present invention in which two permanent magnets 10 are provided on each side of the front surface of the target 6 and two permanent magnets 13 are provided on each side of the rear surface of the target 6. FIG. 4 is a sectional view taken along a line B—B' of FIG. 3. The polarities of the two magnets 10 are disposed on the same side and adjacent to each other are set to be opposite to each other, and the polarities of the two magnets 10 are confronting each other with the target 6 interposed between them are also set to be opposite to each other. The two magnets 13 are disposed on the rear surface of the target 6 in a manner similar to that of the magnets 10.

Figure 5:
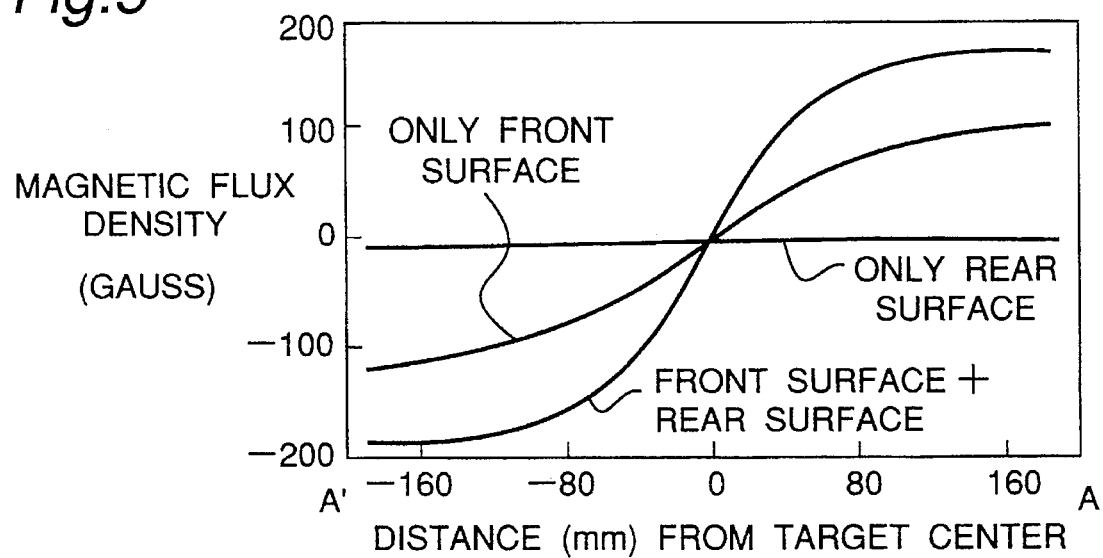
FIG. 5 is a view showing the distribution of magnetic fluxes on the front surface of a target of the sputtering apparatus.

FIG. 5 shows the state of magnetic fluxes generated along a line A—A' of FIG. 3 and spaced at 2 mm from the front surface of the target 6. A magnetic flux directed from left to right in FIG. 3 is taken as being positive. FIG. 5 shows the densities of magnetic fluxes in a case where the magnets 10 are provided on only the front surface of the target 6, a case where the magnets 13 are provided on only the rear surface of the target 6, and a case where the magnets 10 are provided on the front surface of the target 6 and the magnets 13 are provided on the rear surface of the target 6. As indicated by the graph, the density of the magnetic flux generated in the case where the magnets 10, 13 are provided on the front and rear surfaces of the target 6 is higher than that generated in the case where the magnets 10 are provided on only the front surface of the target 6. Further, unlike the case where the magnets 13 are provided on only the rear surface of the target 6, magnetic fluxes hardly leak to the front surface of the target 6 when the magnets 10, 13 are provided on the front and rear surfaces of the target 6. That is, owing to the action of the magnetic flux generated by the magnets 13 disposed on the rear surface of the target 6, the amount of the magnetic flux generated by the magnets 10 provided on the front surface which passes through the target 6 is reduced, and thus the amount of the magnetic flux present on the front surface of the target 6 increases.

An example of each of the magnets 10, 13 is a magnet having a residual induction Br of 1.04–1.14T, a coercive force Hc of 630–800 kA/m, and the maximum energy product (BH)max of 198–247 kJ/m$^3$. An example of the target 6 is a target having the maximum magnetic permeability ($\mu_{max}$) of 73.8.

When the magnetic charges of two magnetic poles of different magnets spaced by a distance (r) are $q_m$, $q_m'$, a magnetic force F caused between them is expressed by the following expression by using MKSA system of units:

$$F = \{1/(4\pi\mu_0)\} * \{q_m \, q_m'/(r^2)\} \tag{1}$$

where $\mu_0$ is a magnetic permeability in vacuum, and $q_m$, $q_m'$ are magnetic charges.

A magnetic filed H at any point is defined by the following expression:

$$F = q_m H \tag{2}$$

where H is a magnetic pole for test of the magnetic charge $q_m'$ and F is a force acting on the magnetic field.

Therefore, the magnetic field at any point away from the magnetic is defined by the above expressions (1) and (2).

The operation of the sputtering apparatus according to the first embodiment is described below with reference to FIG. 11.

Figure 11:
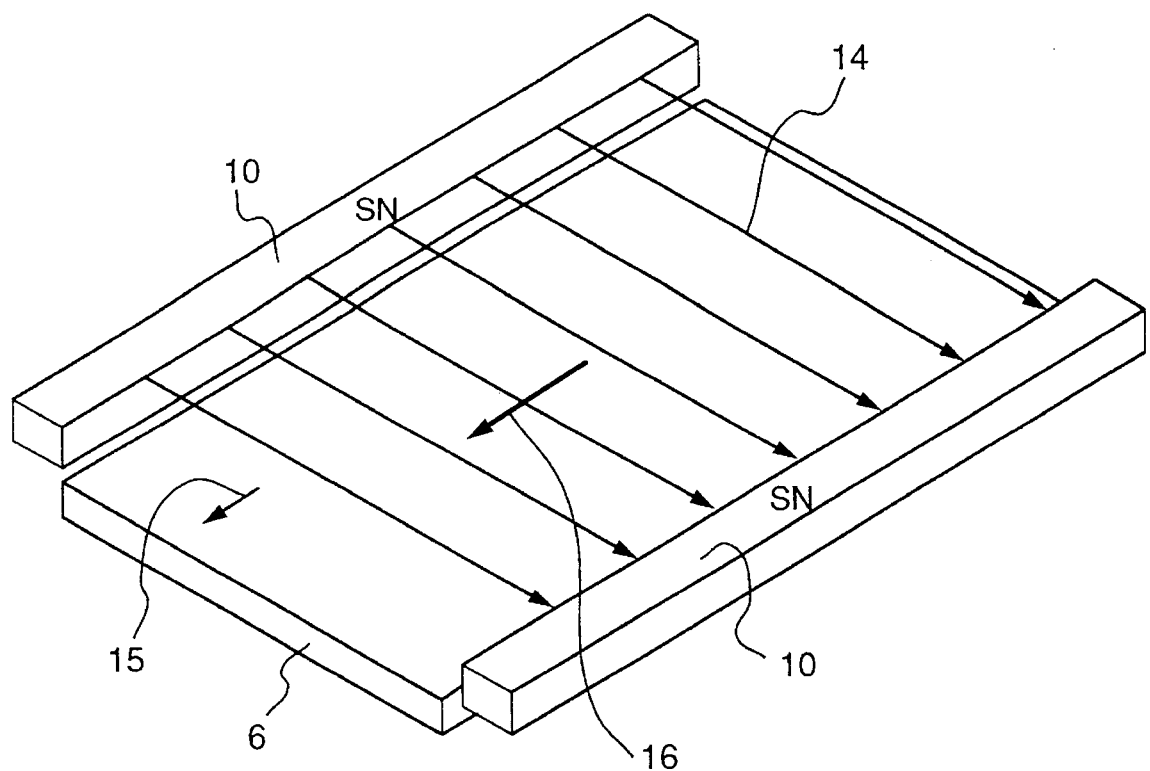
FIG. 11 is a principle view showing forces applied to electrons in plasma by a magnetic field.
Figure 12:
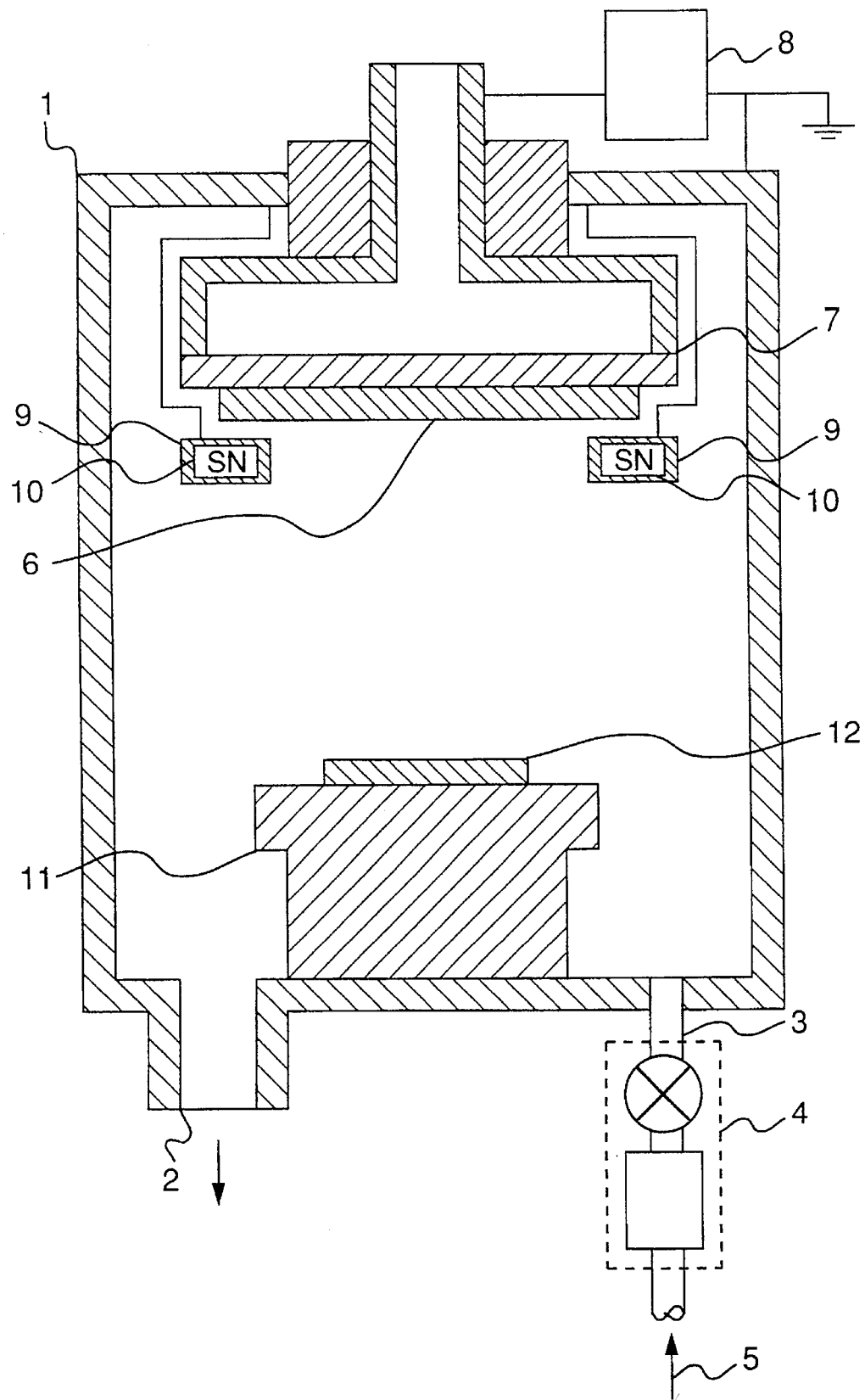
FIG. 12 is a sectional view showing a schematic construction of a conventional sputtering apparatus.

When the magnet 10 is disposed on the rectangular flat plate target 6 as shown in FIG. 11, a magnetic field 14 is generated as shown in FIG. 11. The magnetic field 14 subjects the electrons in the plasma to a force 16 parallel with the surface of the target 6 and the side edge thereof and thus the plasma is collected in a direction shown by a reference numeral 15. Thus, the corrosion speed is highest when the plasma migrate in the direction shown by the reference numeral 15, whereas the corrosion speed is lowest when the plasma migrate in the direction opposite to the direction 15. Therefore, in the conventional apparatus, the utilization efficiency of the target 6 is low, and a film having a uniform thickness cannot be obtained at a high percentage.

According to the first and second embodiments, the direction of the magnetic flux generated by the plural magnets 10 provided on the front surface of the target 6 is the same as that of the magnetic flux generated by the plural magnets 13 provided on the rear surface thereof. Thus, the magnets 13 provided on the rear surface of the target 6 can saturate the magnetic flux inside the target 6 made of ferromagnetic material. Consequently, the magnetic flux generated by a plurality of the magnets 10 provided on the front surface of the target 6 efficiently acts on the formation of the plasma with high density.

The plural magnets 10 are provided along both side edges of the front surface of the target 6. On each side edge, the polarities of the magnets 10 adjacent to each other are opposite to each other, and the polarities of the magnets 10 confronting each other with the target 6 interposed therebetween are also opposite to each other. Thus, the direction of the magnetic field 14 shown in FIG. 11 includes positive and negative directions on the entire front surface of the target 6. For example, the directions of magnetic fluxes generated by the magnets 10, 13 and disposed on both side edges of the target 6 are opposite to each other and symmetrical with respect to a center line connecting a middle point of each side edge of the front surface of the target 6. Accordingly, forces applied by the magnetic field 14 to the electrons of plasma progressing toward the target 6 are not in the same direction, and hence, the electrons are almost uniformly distributed on the target 6, thus exerting sputtering action on the target 6. Thus, the surface of the target 6 is corroded almost uniformly, and thus the surface of the target 6 after sputtering is performed is parallel with the target surface before sputtering is performed. In this manner, the first and second embodiments solve the disadvantage that films having a uniform thickness cannot be reliably formed on the substrate 12.

Further, magnetic fluxes disposed on both side edges of the target 6 force electrons in the plasma to be directed toward the center of the target 6. In this manner, the plasma can be efficiently utilized and the density of the plasma on the target 6 can be increased. Therefore, the target 6 can be corroded at a high speed.

In addition, in the second embodiment, the directions of the magnetic fluxes generated by the magnets 10, 13 disposed on the front and rear surfaces of the target 6 become opposite to each other and symmetrical with respect to a center line connecting the middle point of each side edge of the target 6. This construction allows the two regions of the target 6 divided by the center line to be corroded in the same state.

Figure 6:
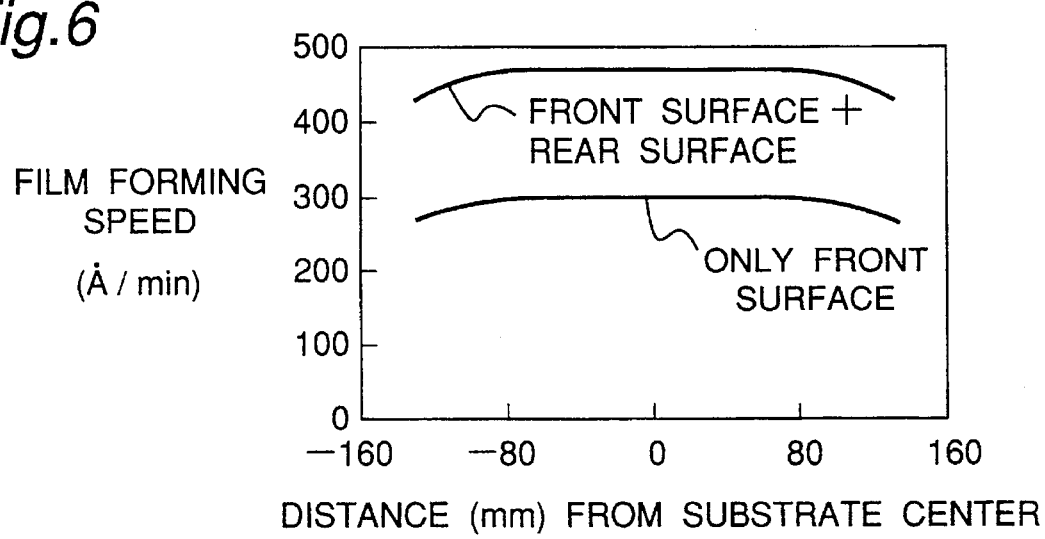
FIG. 6 is a view showing a film forming speed of the sputtering apparatus.

FIG. 6 shows speeds at which films are formed on substrates 12 in the case where the magnets 10 are provided on only the front surface of the target 6 made of ferromagnetic material and in the case where the magnets 10, 13 are provided on both the front and rear surfaces thereof. As apparent from the graph, the film forming speed in the latter case is much higher than that in the former case because the density of the magnetic flux in the latter case is higher than that in the former case.

Referring to FIG. 3, the magnetic flux disposed in the vicinity of one side edge (side edge in the upper side) of the target 6 is directed toward the right in FIG. 3, and a force directed downward in FIG. 3 acts on electrons in the plasma approaching the target 6 from above the sheet, on which FIG. 3 has been drawn, toward the surface of the sheet. The magnetic flux disposed in the vicinity of the other side edge (side edge in the lower side) of the target 6 is directed toward the left in FIG. 3, and a force directed upward in FIG. 3 acts on electrons in the plasma approaching the target 6 from above the sheet, on which FIG. 3 has been drawn, toward the surface of the sheet. Accordingly, plasma on the target 6 is enclosed with the magnetic fluxes and hence the density of the plasma can be increased, thus increasing the corrosion speed and the film forming speed.

A sputtering apparatus according to a third embodiment is described below with reference to FIGS. 7 through 10.

Figure 7:
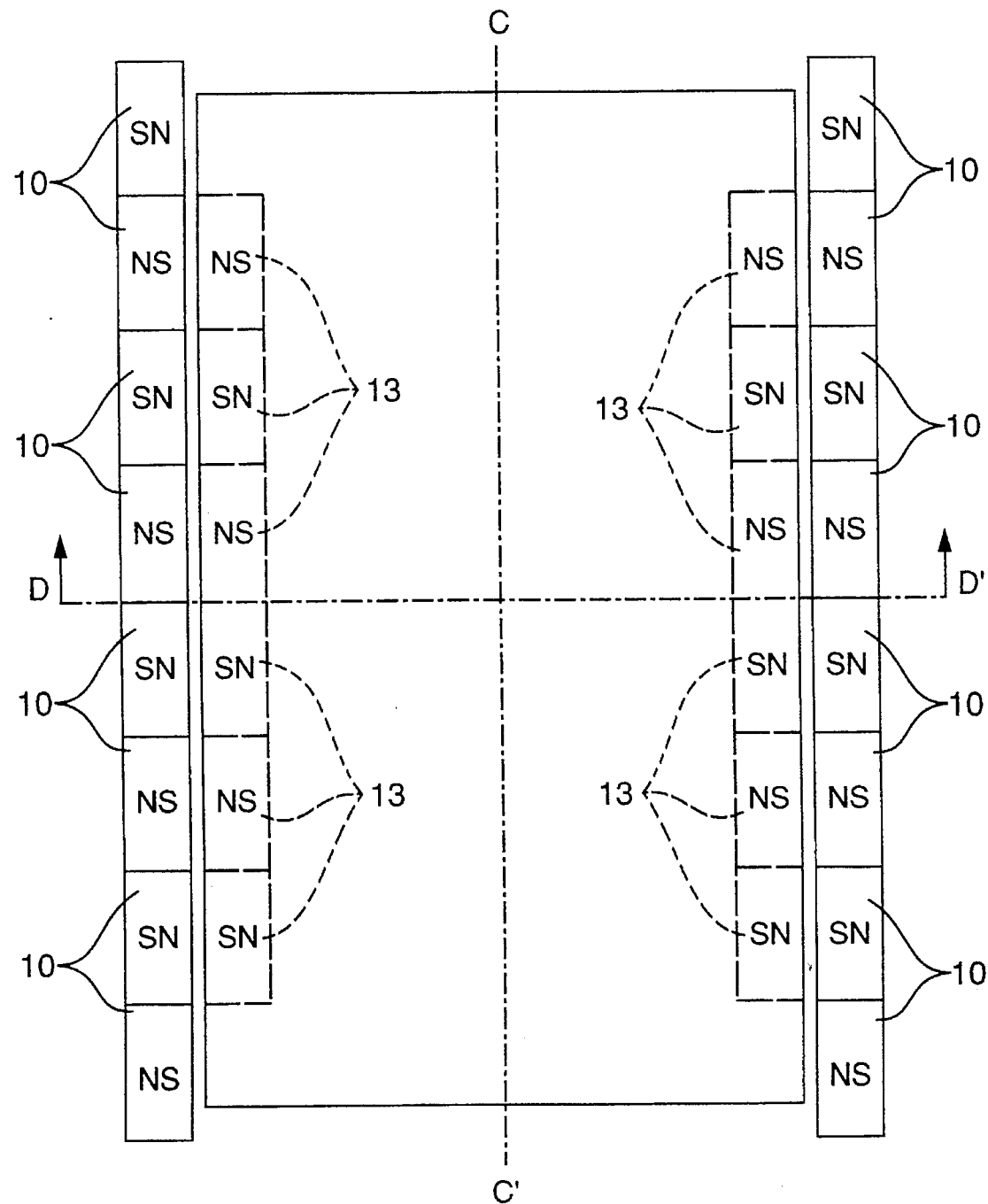
FIG. 7 is a plan view showing the construction of a sputtering electrode of a sputtering apparatus according to a third embodiment of the present invention.
Figure 8:
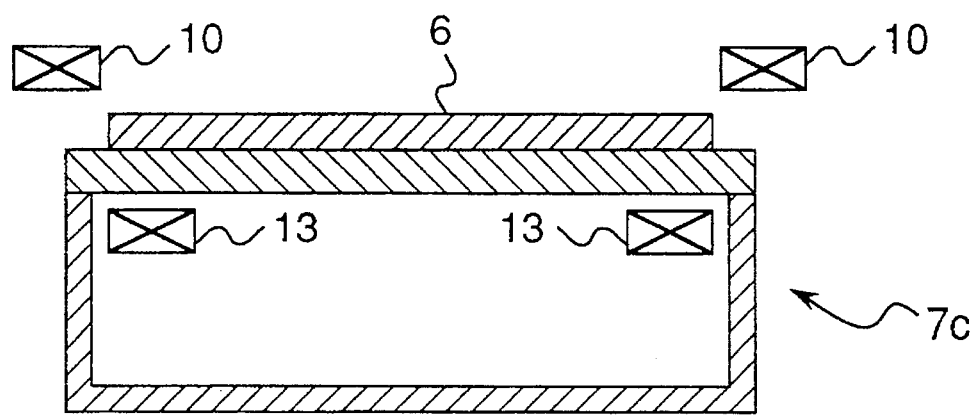
FIG. 8 is a sectional view taken along a line D—D' of FIG. 7.

Similarly to FIG. 3, FIG. 7 is a plan view showing the construction of a sputtering electrode 7c of the sputtering apparatus. FIG. 8 is a sectional view taken along a line D—D' of FIG. 7. Eight permanent magnets 10 are provided along each side edge of the front surface of the target 6. The polarity of each magnet 10 is inverted seven times, and the polarities of two magnets 10 confronting each other with the target 6 interposed therebetween are opposite to each other. Six permanent magnets 13 are provided along each side edge of the rear surface of the target 6. The polarity of each magnet 13 is inverted five times, and the polarities of two magnets 13 confronting each other are opposite to each other with the target 6 interposed therebetween as well. Further, except the magnets 10 disposed at both ends of the row of the magnets 10, the magnets 10 and 13 are arranged such that the polarity of each of the magnets 10 is the same as that of the corresponding magnet 13 disposed on the rear surface of the target 6.

Figure 9:
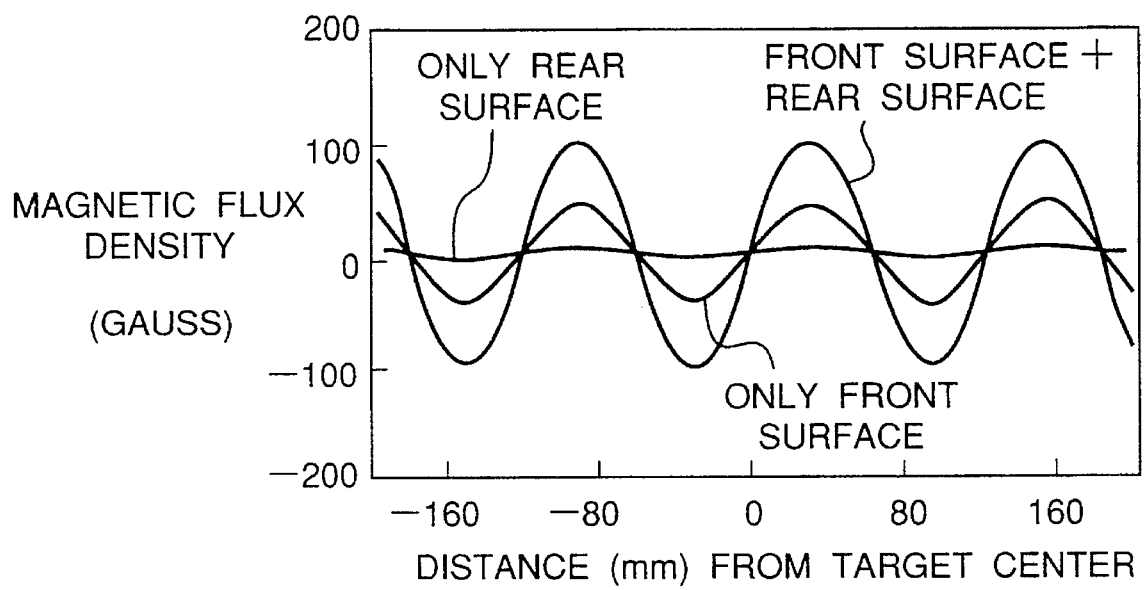
FIG. 9 is a view showing the distribution of magnetic fluxes on the front surface of a target of the sputtering apparatus according to the third embodiment.

FIG. 9 shows the state of magnetic fluxes generated along a line C—C' of FIG. 7 and spaced at 2 mm from the front surface of the target 6. Similarly to FIG. 5, a magnetic flux directed from left to right in FIG. 7 is taken as being positive. FIG. 9 shows the densities of magnetic fluxes in a case where the magnets 10 are provided on only the front surface of the target 6, a case where the magnets 13 are provided on only the rear surface of the target 6, and a case where the magnets 10 are provided on the front surface of the target 6 and the magnets 13 are provided on the rear surface of the target 6. As indicated by the graph, the density of the magnetic flux generated in the case where the magnets 10, 13 are provided on the front and rear surfaces of the target 6 is higher than that generated in the case where the magnets 10 are provided on only the front surface of the target 6. Further, the densities of the magnetic fluxes on the target 6 can be uniformalized by increasing the number of inversions of the directions of the magnetic fluxes.

Figure 10:
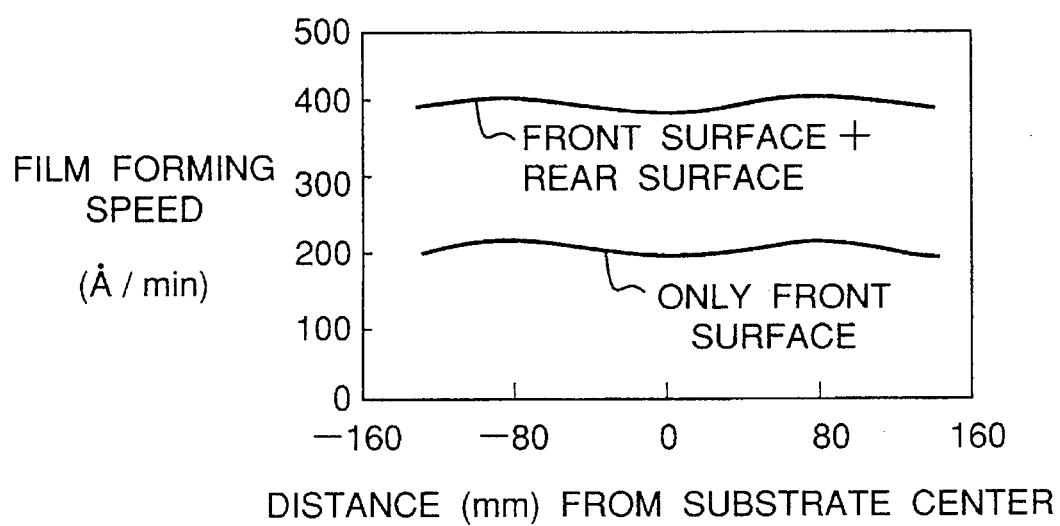
FIG. 10 is a view showing a film forming speed of the sputtering apparatus according to the third embodiment.

FIG. 10 shows speeds at which films are formed on substrates 12 in the case where the magnets 10 are provided on only the front surface of the target 6 made of ferromagnetic material and in the case where the magnets 10, 13 are provided on both the front and rear surfaces thereof. As apparent from the graph, the film forming speed in the latter case is much higher than that in the former case because the density of the magnetic flux in the latter case is higher than that in the former case. Particles are deposited uniformly on both sides of the substrate in particular to improve the thickness distribution by increasing the number of repetition times of the line of magnetic force. This advantage can be obtained owing to a uniform distribution of plasma.

As described above, according to the third embodiment, a thin film made of the ferromagnetic material grows on the substrate 12 at a high speed and the film is allowed to have a uniform thickness by disposing the magnets 10, 13 on the front and rear surfaces of the target 6 and inverting the polarities of the magnets 10, 13 many times.

In the third embodiment, the direction of the magnetic flux is inverted three times or more on a center line parallel with the side edges of the target 6. This construction allows the target 6 to be corroded uniformly. Hence, a film having a uniform thickness can be formed by sputtering the target 6 of various sizes. It is possible to change the number of the magnets 10, 13, according to the embodiments, constituting the magnetic circuit to any desired number.

As apparent from the foregoing description, the distribution of plasma in the vicinity of the target is uniform and the target corrosion is leveled. Thus, a film having a uniform thickness can be formed on the substrate. The magnets are provided along each side edge of the rear surface of the target such that the polarities of the magnets adjacent to each other are opposite to each other. The target of ferromagnetic material is magnetized by the magnets disposed on the rear surface of the target, not by the magnets on the front surface thereof. Thus, the magnetism inside the target is saturated, and a sufficiently strong magnetic field is formed on the front surface of the target. In this manner, the effect of the magnetron can be conspicuously displayed and the thin film can be formed at a high speed.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A sputtering apparatus for performing sputtering operation by using a rectangular target made of ferromagnetic material, the apparatus comprising an electrode in which one first permanent magnet is disposed on each side edge of a front surface of the target, polarities of the first permanent magnets confronting each other with the target interposed between the first permanent magnets are opposite to each other, one second permanent magnet is disposed on each side edge of a rear surface of the target, polarities of the second permanent magnets confronting each other with the target interposed between the second permanent magnets are opposite to each other, and the polarity of each second permanent magnet disposed on the rear surface of the target is the same as that of the first permanent magnet disposed on the front surface of the target.

2. The sputtering apparatus as claimed in claim 1, wherein the electrode has a plurality of first permanent magnets disposed on each side edge of the front surface of the target with the first permanent magnets disposed on the same side edge and adjacent to each other being set to be opposite to each other; and a plurality of second permanent magnets disposed on each side edge of the rear surface thereof with the second permanent magnets disposed on the same side edge and adjacent to each other being set to be opposite to each other.

3. The sputtering apparatus as claimed in claim 2, wherein directions of magnetic fluxes generated by the first and second permanent magnets and disposed on both side edges of the target are set to cause electrons in plasma to be migrated toward a center of the target.

4. The sputtering apparatus as claimed in claim 3, wherein directions of magnetic fluxes generated by the first and second permanent magnets and disposed on both side edges of the target are opposite to each other and symmetrical with respect to a center line connecting a middle point of each side edge of the front surface of the target.

5. The sputtering apparatus as claimed in claim 4, wherein directions of magnetic fluxes generated by the first and second permanent magnets are inverted three times on a center line parallel with the side edges of the target.

6. The sputtering apparatus as claimed in claim 3, wherein directions of magnetic fluxes generated by the first and second permanent magnets are inverted three times on a center line parallel with the side edges of the target.

7. The sputtering apparatus as claimed in claim 2, wherein directions of magnetic fluxes generated by the first and second permanent magnets and disposed on both side edges of the target are opposite to each other and symmetrical with respect to a center line connecting a middle point of each side edge of the front surface of the target.

8. The sputtering apparatus as claimed in claim 7, wherein directions of magnetic fluxes generated by the first and second permanent magnets are inverted three times on a center line parallel with the side edges of the target.

9. The sputtering apparatus as claimed in claim 2, wherein directions of magnetic fluxes generated by the first and second permanent magnets are inverted three times on a center line parallel with the side edges of the target.

10. The sputtering apparatus as claimed in claim 1, wherein magnetic flux inside the target is saturated by the second permanent magnets.

11. The sputtering apparatus as claimed in claim 1, wherein directions of magnetic fluxes caused by the first and second permanent magnets and disposed on both side edges of the target are set to cause electrons in plasma to be migrated toward a center of the target.

* * * * *